(12) United States Patent
Ehrfeld et al.

(10) Patent No.: US 7,086,145 B2
(45) Date of Patent: Aug. 8, 2006

(54) MAGAZINE, ASSEMBLY DEVICE FOR MICROCOMPONENTS

(75) Inventors: Wolfgang Ehrfeld, Mainz (DE); Matthias Nienhaus, Mainz (DE); Udo Berg, Bad Homburg (DE); Felix Schmitz, Mainz (DE); Marc Begemann, Barntrup (DE); Yannick Ansel, Mainz (DE)

(73) Assignee: Institut fur Mikrotechnik Mainz GmbH, Mainz (DE)

( * ) Notice: Subject to any disclaimer, the term of this patent is extended or adjusted under 35 U.S.C. 154(b) by 393 days.

(21) Appl. No.: 10/220,210

(22) PCT Filed: Feb. 27, 2001

(86) PCT No.: PCT/EP01/02195

§ 371 (c)(1),
(2), (4) Date: Nov. 21, 2002

(87) PCT Pub. No.: WO01/64388

PCT Pub. Date: Sep. 7, 2001

(65) Prior Publication Data

US 2003/0088966 A1 May 15, 2003

(30) Foreign Application Priority Data

Feb. 29, 2000 (DE) ................................. 100 09 386

(51) Int. Cl.
*B23Q 7/10* (2006.01)
(52) U.S. Cl. ........................... 29/809; 29/729; 29/759; 29/816
(58) Field of Classification Search ................ 324/158, 324/73, 158.73; 414/5; 29/729, 575, 759, 29/761, 809, 816, 281.1, 281.2, 592; 206/488, 206/459.1
See application file for complete search history.

(56) References Cited

U.S. PATENT DOCUMENTS 3,731,867 A * 5/1973 Frisbie et al. ................. 228/6.2

(Continued)

FOREIGN PATENT DOCUMENTS

DE          3928712          3/1990

(Continued)

OTHER PUBLICATIONS

Flexible Montage von Miniaturbauteilen, Gunther Reinhart, et al, Mikrotechnik, pp. 43-45, F&M 105 (1997) 1-2, Carl Hanser Verlage, Munchen.

*Primary Examiner*—John C. Hong
(74) *Attorney, Agent, or Firm*—Hudak, Shunk & Farine, Co. LPA

(57) ABSTRACT

The invention relates to an assembly device for microcomponents that are disposed in a magazine. The inventive assembly device does not require any optical systems and allows for an exact positioning of the microcomponents. The assembly will also be unaffected by any position changes of the microcomponents caused by wastage. The assembly device is provided with mechanical alignment devices that engage with or act upon adjustment structures of the magazine. The assembly device further comprises clamping devices for fixing the magazine and at least one plunger for ejecting at least one microcomponent from the magazine. An assembly platform is provided in the upper tool or in the lower tool of the assembly device and receives the microcomponents in a defined position. The invention further relates to a method for assembling microcomponents and to a corresponding magazine.

24 Claims, 7 Drawing Sheets

U.S. PATENT DOCUMENTS

| | | | |
|---|---|---|---|
| 4,479,089 A * | 10/1984 | Ferri et al. | 324/755 |
| 4,693,370 A | 9/1987 | Aceti | |
| 5,709,303 A * | 1/1998 | Best | 206/459.1 |
| 6,164,448 A * | 12/2000 | Schmutz et al. | 206/488 |
| 6,851,174 B1 * | 2/2005 | Ehrfeld et al. | 29/527.1 |

FOREIGN PATENT DOCUMENTS

| | | |
|---|---|---|
| DE | 197 09 136 | 9/1998 |
| EP | 0 044 519 | 1/1982 |

\* cited by examiner

MAGAZINE, ASSEMBLY DEVICE FOR MICROCOMPONENTS

FIELD OF THE INVENTION

The invention relates to a magazine and an assembly device for microcomponents that are arranged in the magazine. The invention further relates to a method for assembling microcomponents that are arranged in a magazine.

BACKGROUND OF THE INVENTION

Microcomponents are delivered to the processor in a magazine, where they must be removed from the magazine for assembly. In a magazine such as the one described, for instance, in German Laid Open Publication DE 197 09 136 A1, the microcomponents are integrated in the wafer-type magazine, so that they are protected from damage during transport. The microcomponents must be ejected from this magazine by means of a plunger.

For this purpose, the entire magazine wafer must first be positioned in such a way that each component that is to be removed from the magazine is exactly at the location where it is to be installed in an already existing structure of microcomponents. If, for instance, a gear unit is to be assembled from microcomponents, the corresponding gears must be positioned exactly above the shafts that are to receive them and must then be ejected from the magazine. Currently, the magazine wafers are grasped and positioned either by hand or by means of an automatically operated gripper system.

Positioning by hand decisively depends on the skill and concentration of the person involved. Positioning aids that may be arranged in the magazine can be used only to a limited extent or not at all.

In automatic gripper systems, limit stops are used, for instance, against which the edge of the magazine wafer is placed. However, due to the shrinkage of the magazine and microcomponent material that occurs during the manufacturing process, the position of the microcomponents changes. The molding tool is therefore made larger, so that this systematic shrinkage during production of the microcomponents is taken into account. Shrinkage tolerances, however, result in positional tolerances of the microcomponents within the magazine. Consequently, even those microcomponents that are arranged adjacent to the guide edge may have shifted, such that they are not arranged at the intended position within the magazine. To be able to remove a plurality of components from the wafer magazine, the magazine must be pushed back and forth by means of a displacement device, so that incorrect positions of microcomponents can add up. This has the result that the ejection tools, such as plungers or the like, are not arranged at the position where the components to be removed are actually located, or the components to be removed are not located exactly above the position where the structure receiving them is arranged. This causes damage to either the components or the magazine, or damage to the larger microstructures on which the microcomponents are to be mounted, or even damage to the ejection tools.

Optical methods, i.e. image analysis processes, are therefore already being used for the positioning of microcomponents, as described, for instance, in G. Reinhart et al., "Flexible Montage von Miniaturbauteilen" [Flexible Assembly of Miniature Components], F+M 105 (1997) 1-2, pp. 43–45. This presents the problem of insufficient contrast, however, because both the magazine and the microcomponents are made of similar materials or, if a separator is produced, even of identical materials. As a result, the position of the corresponding microcomponents cannot be determined exactly. Consequently, the required accuracy of 5 μm and better, which is often required for the precise positioning of the microcomponents, cannot be met.

A further drawback is that image recognition and analysis systems are costly and require a relatively long time for positioning because the wafer magazine or the tools must be moved in several spatial directions.

Furthermore, the wafer magazine can bend as the microcomponents are ejected, which also causes malpositioning.

SUMMARY OF THE INVENTION

Thus, it is the object of the invention to provide an assembly device that does not require the use of optical systems and that ensures precise positioning of the microcomponents arranged in a magazine. Any positional changes of the microcomponents that occur due to shrinkage should not affect the assembly process. A further object of the invention is to provide a magazine that enables a simple positioning of microcomponents and a method for assembling microcomponents arranged in the magazine, in which damage to the microcomponents or the magazine or the ejection tools is prevented.

This object is attained by an assembly device having an upper tool and a lower tool. These tools are provided with mechanical alignment means, clamping means, plungers and an assembly platform.

Mechanical alignment means are provided, which engage with adjustment structures of the magazine.

For this purpose, the magazine according to the invention is provided with adjustment structures for engagement with mechanical alignment means during the assembly of the microcomponents. Possible adjustment structures are projections, indentations or openings in the magazine material with which the alignment means interact to bring about the alignment of the microcomponents located in the magazine.

The adjustment structures are preferably circular, cylindrical, triangular, square or polygonal structures formed in the magazine material. The adjustment structures are preferably openings with a diameter of 100 μm to 3 mm.

In the simplest case, the adjustment structures are circular holes or openings in the magazine material.

These adjustment structures can essentially be divided into three groups. The adjustment structures can be provided on the magazine level, the cluster level or the microcomponent level, which depends on the tolerances of the components to be assembled, their arrangement and the shrinkage of the magazine and microcomponent material. The best positioning accuracy is achieved if adjustment structures for positioning the magazine and the microcomponents are used on the component level. The adjustment structures on the component level are arranged adjacent to the microcomponent to be removed, so that material shrinkage is negligible because the distances between the component to be assembled and the associated adjustment structure are small.

The adjustment structures on the magazine level, cluster level or component level can have the same size. It is advantageous, however, if the adjustment structures decrease in size from the magazine level to the microcomponent level because they would otherwise require too much space due to the clearly greater number of structures.

Preferred therefore are diameters ranging from 1 mm to 3 mm are used for the adjustment structures on the magazine level, from 500 µm to 1 mm on the cluster level and 100 µm to 500 µm on the component level.

The adjustment structures of all the levels are preferably provided in a regular arrangement. Since the assembly device and the device for displacing the magazine are computer-controlled, the arrangement of the adjustment structures is preferably selected in such a way that programming of the control units is made as simple as possible.

The assembly device is further provided with clamping means for fixing the magazine. These clamping means are arranged in such a way that they engage with the magazine in the area of the components to be assembled, so that when the microcomponents are ejected from the magazine, bending and thus positional shifting of the microcomponents is nearly prevented.

The clamping means are preferably integrated in the alignment means. This means that the magazine, during adjustment, is also clamped or fixed, either at the same time or offset in time.

Furthermore, at least one plunger is provided for ejecting at least one microcomponent. This plunger is preferably arranged between the alignment and/or clamping means. It is advantageous if the upper and lower tools each have at least two alignment structures between which the microcomponent or components to be assembled are arranged.

Finally, the assembly device is also provided with an assembly platform, which can be arranged in the lower or in the upper tool. The microcomponents or other larger component structures that are to be equipped with additional microcomponents are placed on this assembly platform. The assembly platform thus serves to receive the positioned microcomponents. The assembly platform and the plunger can preferably be moved independently from one another perpendicularly to the surface of the magazine. It is also possible to provide a coupled movement of the assembly platform and the plunger.

The mechanical alignment means preferably comprise an upper and a lower alignment device, which are arranged opposite one another. At least one of the alignment devices is movable in vertical direction. Since the magazine is placed horizontally into the assembly device, the vertical direction is identical with the direction normal to the plane of the magazine.

At least one of the alignment devices is provided with at least one pin, which is preferably a pilot pin that engages with the corresponding adjustment structure of the magazine. The diameter of the pilot pins preferably ranges from 100 µm to 3 mm and is adapted to the adjustment structures.

The pin preferably has a center point, so that when the pin engages with the adjustment structure, the magazine can be laterally shifted into the intended position. If the magazine has first been roughly adjusted, the engagement of the pins with the adjustment structure of the magazine causes a fine adjustment of the magazine and thus the components to be removed from the magazine.

The center point preferably has a truncated cone shaped or a conical surface. The associated cone angle is preferably 50° to 90°.

Furthermore, the pilot pin is advantageously arranged on a base part with a shoulder. The foil magazine rests against this shoulder during the alignment process. A clamping device engaging on the opposite side of the magazine is used to press the magazine against this shoulder and thus to clamp it.

The pilot pin preferably merges into the shoulder via a truncated cone shaped collar. During the clamping process, the truncated cone shaped collar is pressed into the magazine material, which further enhances the clamping action and improves the positioning tolerance.

The length of the pilot pin is preferably larger than the thickness of the magazine, such that the pilot pin reaches through the magazine and protrudes on the opposite side of the magazine. The opposite alignment device is preferably provided with a pin socket with which the pilot pin engages. This can simultaneously ensure a mutual fine adjustment of the upper and the lower tool, so that assembly accuracy is further improved.

The pin socket preferably has a flat end face that presses against the outside of the magazine and thus, in cooperation with the pilot pin or its shoulder, clamps the magazine.

Irrespective of the mutual adjustment of the upper and lower tool by means of the pilot pins, the upper and lower tool can be arranged so as to be adjustable in relation to the respectively other tool, which is made possible by corresponding control devices.

The plunger is preferably arranged in the upper tool, so that the microcomponents can be ejected from the magazine in downward direction.

The assembly device has the advantage that material shrinkage does not negatively affect the assembly of the microcomponents. The alignment of the magazine by means of adjustment structures, which are added to the magazine when the microcomponents are produced, makes it possible in the assembly process to use the existing positional accuracy of the microcomponents, which is already realized in the magazine. The simultaneous clamping fixation of the magazine in the area of the adjustment structures nearly prevents the magazine from bending in the area of the microcomponents to be assembled. Optical systems do not have to be used for adjustment. Optical systems may possibly be used to check whether a magazine is present in the device.

The adjustment of the magazine and the microcomponents can be combined with an additional adjustment of the upper and lower tool of the assembly device. At the same time, the plunger is aligned relative to the previously positioned microcomponents in the opposite tool of the assembly device. In this manner, the microcomponents are adjusted relative to the tools of the assembly device and relative to the existing microcomponents that are to receive the components to be assembled. Damage to the microcomponents is thus prevented.

Preferably, the plunger or plungers, the assembly platform and the pins can be exchanged. This exchange can take place automatically, so that the assembly device becomes an assembly robot or stepper. This makes it possible to adapt the device to different microcomponents and magazines, so that even complex structures can be assembled in a simple manner.

The method for assembling the microcomponents arranged in a magazine provides that the magazine is grasped and positioned together with the microcomponent to be assembled and is first roughly adjusted. Subsequently, the magazine is fine adjusted by means of adjustment structures disposed in the magazine and the microcomponent to be assembled is then ejected from the magazine.

The fine adjustment is preferably done by means of adjustment structures on the magazine level, the cluster level or the microcomponent level.

The fine adjustment is effected by the engagement of mechanical alignment means with the adjustment structures. This causes the magazine to be adjusted or shifted on the magazine level.

The magazine, during adjustment, is preferably clamped either at the same time or offset in time. During the adjustment process, the magazine is displaceably supported in the horizontal plane so that the positional change that occurred due to shrinkage can be compensated.

The magazine is preferably arranged above the assembly position of the microcomponents and is ejected onto an assembly platform.

The component or components located on the assembly platform, e.g. microcomponents or larger component structures, are fixed by applying a vacuum.

The finished microsystem, e.g. a gear unit, is removed, for instance, by a gripper.

An alternative provides that the magazine be used to remove the finished microsystem. The last microcomponent to be mounted is preferably ejected only partially from the magazine, such that on the one hand it is still anchored in the magazine and on the other hand it is also already pressed onto the component structure to be equipped, which holds it. As the magazine is removed from the assembly device, the finished microsystem can also be removed from the assembly device.

BRIEF DESCRIPTION OF THE DRAWINGS

Exemplary embodiments of the invention will now be described in greater detail with reference to the drawings in which.

DETAILED DESCRIPTION OF THE INVENTION

Figure 1:
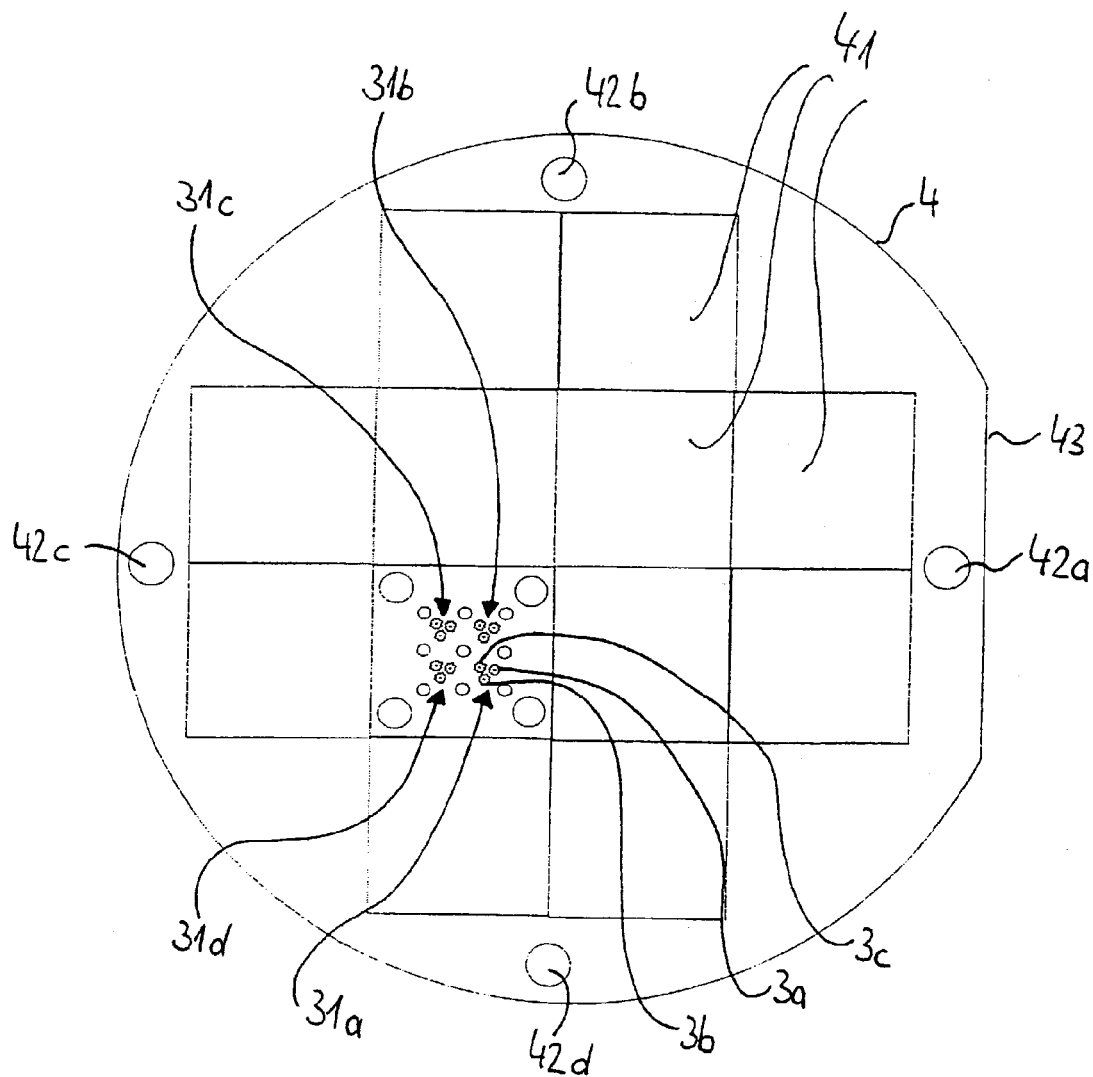
FIG. 1 is a top view of a wafer-type magazine.

FIG. 1 is a top view of a wafer-type magazine 4, which is divided into square clusters 41 in which microcomponents 3 are arranged. This is a so-called foil magazine in which the microcomponents are integrated. In the embodiment shown, the microcomponents 3 are gears, which as planetary gears are to be built into a gear unit. For this reason, the gears are arranged in groups of three 31a–d according to their subsequent position in the gear unit.

The wafer-type magazine 4 has a round outer contour with a straight stop face 43. Along the outer circumference, four equidistant adjustment structures 42a–d in the form of circular holes are provided. These are adjustment structures on the wafer level.

Figure 2:
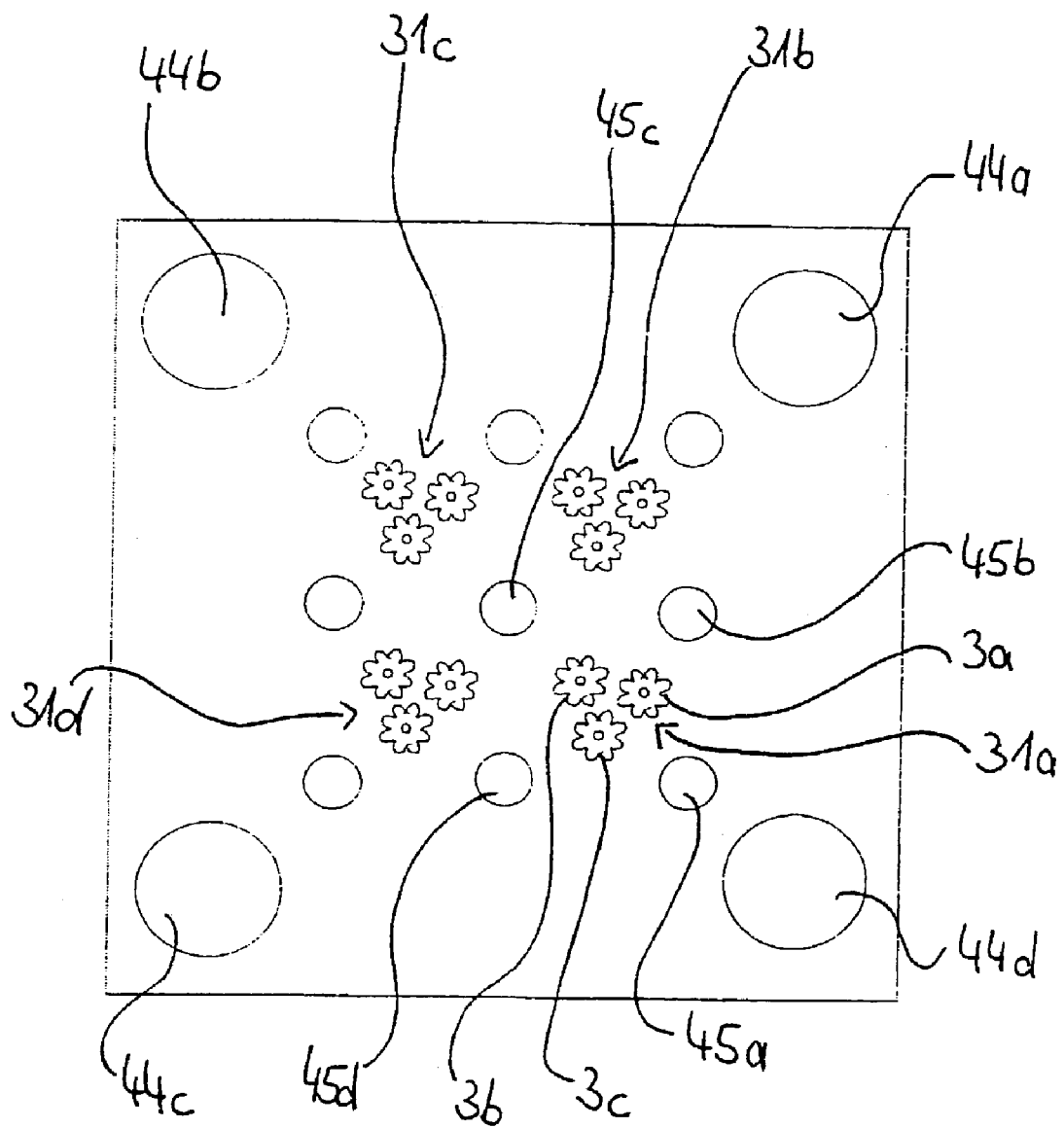
FIG. 2 is a top view of a cluster of the magazine wafer shown in FIG. 1.

Each cluster 41 also has adjustment structures 44a–d in the four corner points, as may be seen in detail in FIG. 2. The four microcomponent groups also have associated adjustment structures 45a–d which are arranged around the corresponding microcomponent group 31a–d. Both the adjustment structures 44a–d and the adjustment structures 45a–d are holes with which the alignment means can engage. Depending on whether the positional tolerances of the microcomponents due to the shrinkage of the magazine and component material are large or small compared to the assembly tolerances of the microcomponents, the adjustment structures 42a–d, the adjustment structures 44a–d or the adjustment structures 45a–d can be used for aligning the magazine 4 or the microcomponents 3a–c.

Figure 3:
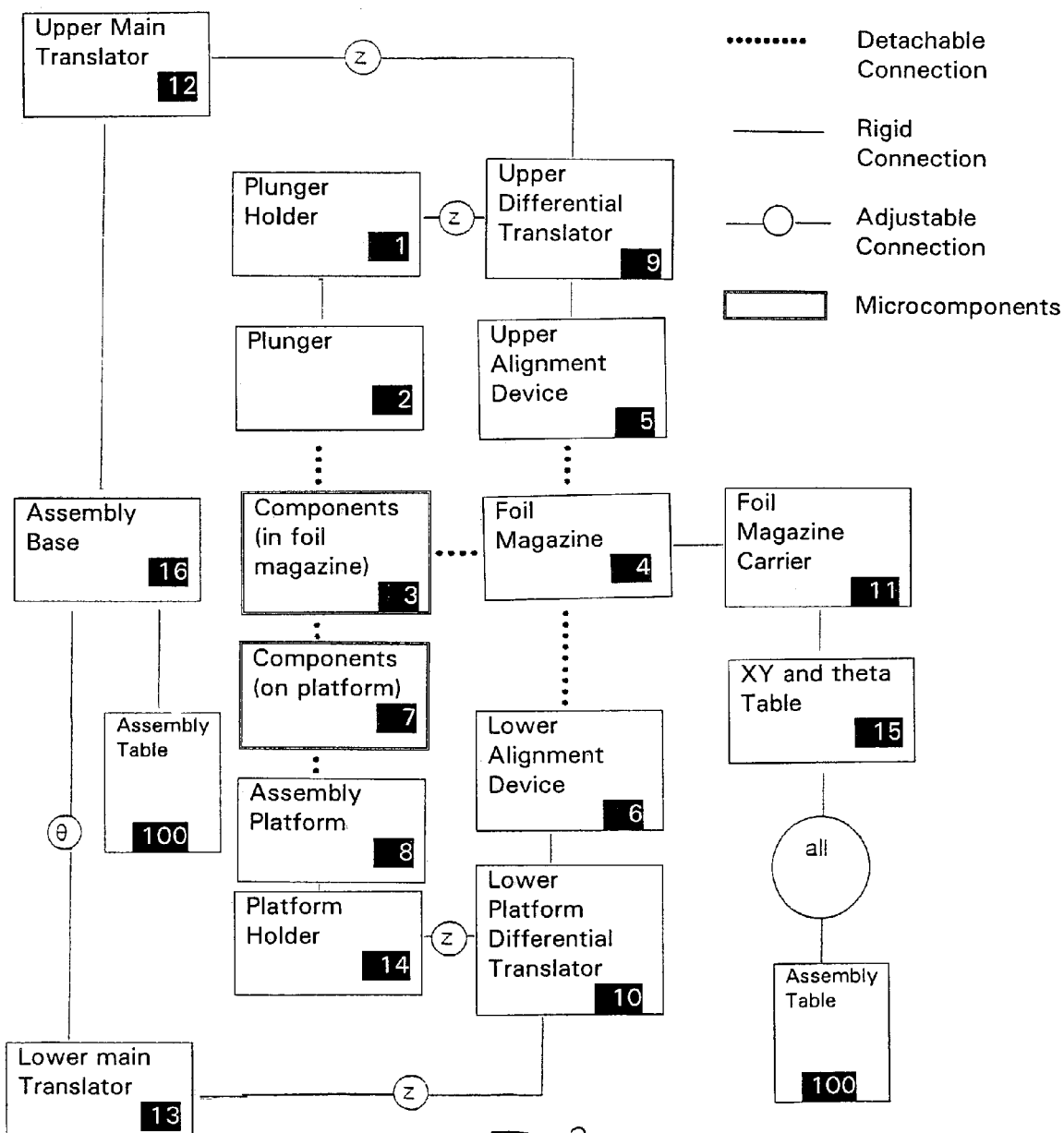
FIG. 3 is a schematic sketch of an assembly device.

FIG. 3 shows a schematic outline of an inventive assembly device. The foil magazine 4 is located on a foil magazine carrier 11 arranged on a table, which enables displacement in XY direction as well as a pivoting motion about the normal to the magazine surface (Z axis). This so-called XY and theta table 15 is located on an assembly table 100. The upper tool comprises an upper main translator 12, which is movable in Z direction. On or in this main translator 12 an upper differential translator 9 is arranged, which can be moved in Z direction relative to the upper main translator 12. The upper differential translator 9 carries a plunger holder 1, which is also movable in Z direction relative to the upper differential translator 9. The plunger holder 1 carries a plunger 2 by means of which the microcomponents 3 that are arranged in the foil magazine are ejected from the magazine.

The lower tool is also provided with a lower main translator 13, which is movable in Z direction. On or in the lower main translator 13, a lower differential translator 10 is arranged, which is also movable in Z direction. The lower differential translator 10 carries a platform holder 14 on which an assembly platform 8 is mounted, which may possibly carry previously assembled microcomponents 7. Both the upper main translator 12 and the lower main translator 13 are arranged on an assembly base 16. Either the lower or the upper main translator is pivotable about the Z axis relative to the assembly base 16. The adjustment means of the upper and the lower tool or their components make it possible to adjust the device components relative to one another. This adjustment is done before the microcomponents are assembled. Thereafter, the mutual assignment of the components does not have to be changed again.

Figure 4A:
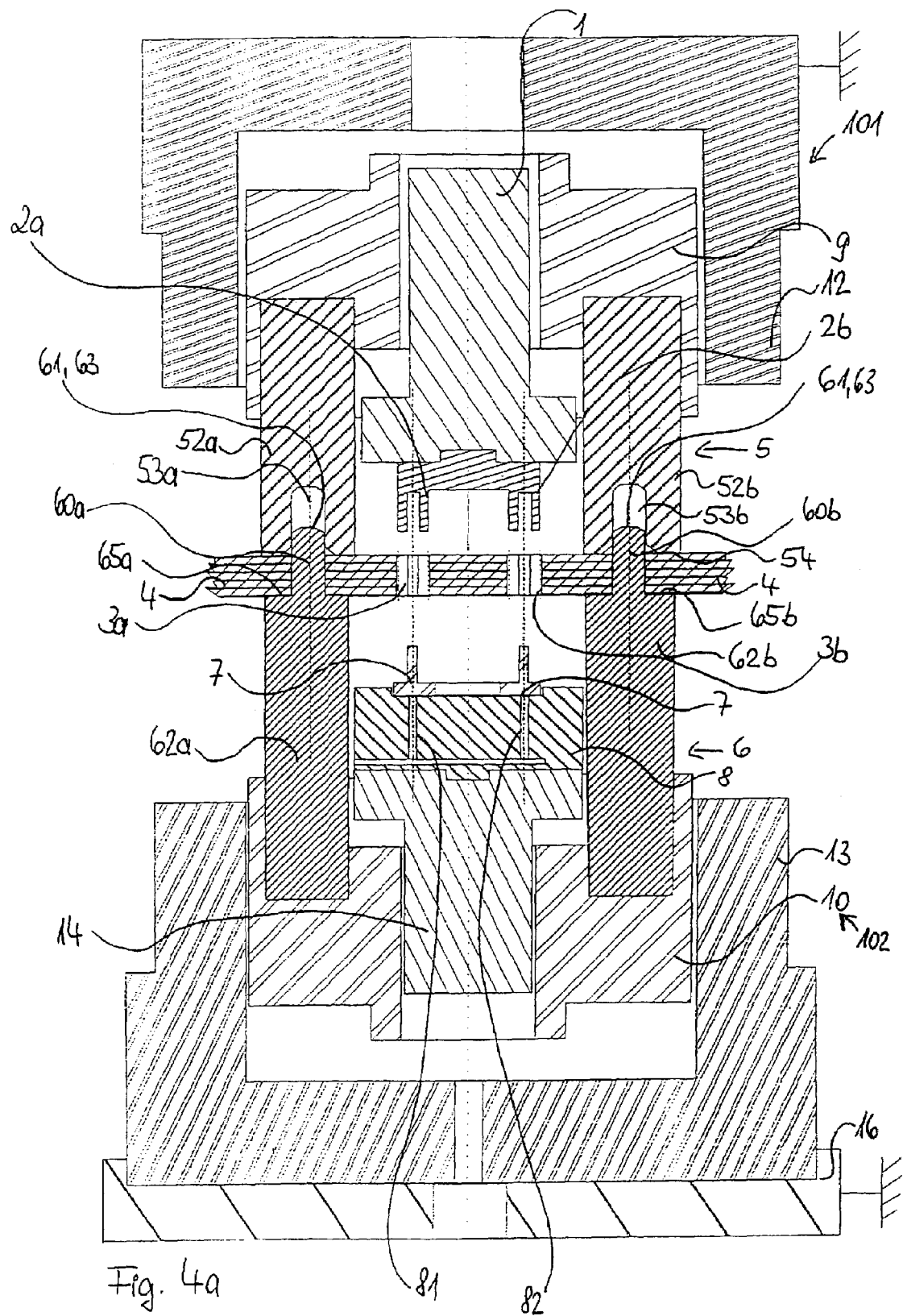
FIGS. 4a, b are vertical sections through an assembly device according to a first embodiment.

FIG. 4a, b shows a vertical section through an assembly device, which comprises an upper tool 101 and a lower tool 102, between which the magazine with microcomponents 3a and 3b is horizontally arranged.

The magazine 4 is held by a magazine carrier 11 and is roughly positioned by shifting the magazine carrier 11. Magazine carrier 11 comprises a lower part 11a and an upper part 11b. The lower part 11a is provided with pins 11c, which engage with the adjustment structures 42a–d or 44a–d of the magazine 4. The individual components of the upper tool 101 or the lower tool 102 have already been described with reference to FIG. 3, so that only details of the alignment device will now be explained.

The upper alignment device 5 is fixed in the upper differential translator 9 and is lifted or lowered by the vertical movement of the upper differential translator. In the view shown in FIG. 4a, b, the upper alignment device 5 has already been lowered onto the topside of foil magazine 4. The upper alignment device 5 has two pins 52a and 52b between which the two plungers 2a and 2b and the plunger holder 1 are arranged. The plunger holder 1 is vertically movable relative to the upper differential translator 9. Each pin 52a and 52b at its free end is provided with an axial bore that serves as a pin socket 53a, b for the pilot pins 60a, b, which will be described in greater detail below. Pins 52a, b have a flat end face 54, which acts as a clamping means pushing against the topside of magazine 4.

Opposite pins 52a, b, two pilot pins 60a and 60b of the lower alignment device 6 are arranged in the lower tool 102. These pilot pins 60a, b have a center point 61 with a truncated cone shaped surface 63 and are arranged on a base part 62a, b, which is provided with a shoulder 65a, b. The length of the pilot pins 60a, b is larger than the thickness of the magazine 4, so that pilot pins 60a, b reach through the adjustment structures 45*a, b* and engage with the pin socket 53*a, b*. With this, not only a positioning in terms of a fine adjustment of magazine 4 is performed, but at the same time possibly also a mutual alignment of the upper tool and the lower tool. Magazine 4 is clamped between the end faces 54 of pins 52*a, b* and shoulder 65*a, b* of the pilot pins 60*a, b*.

After adjustment and clamping of magazine 4, the plunger holder 1 with plungers 2*a, b* is lowered and the microcomponents 3*a, 3b* are ejected downwardly from magazine 4. Assembly platform 8, which is provided with suction ducts 81 and 82, is arranged on platform holder 14. By applying a vacuum, microcomponents 7*a, b* are fixed on the assembly platform 8.

Through the mutual alignment of the upper and lower tool and the adjustment of magazine 4, the bores of gears 3*a, b* are aligned with the pins of microcomponents 7*a, b*. By lowering plungers 2*a, b*, the microcomponents 3*a, b* are ejected downwardly from magazine 4 and placed onto the existing microcomponents 7*a, b*.

Figure 4B:
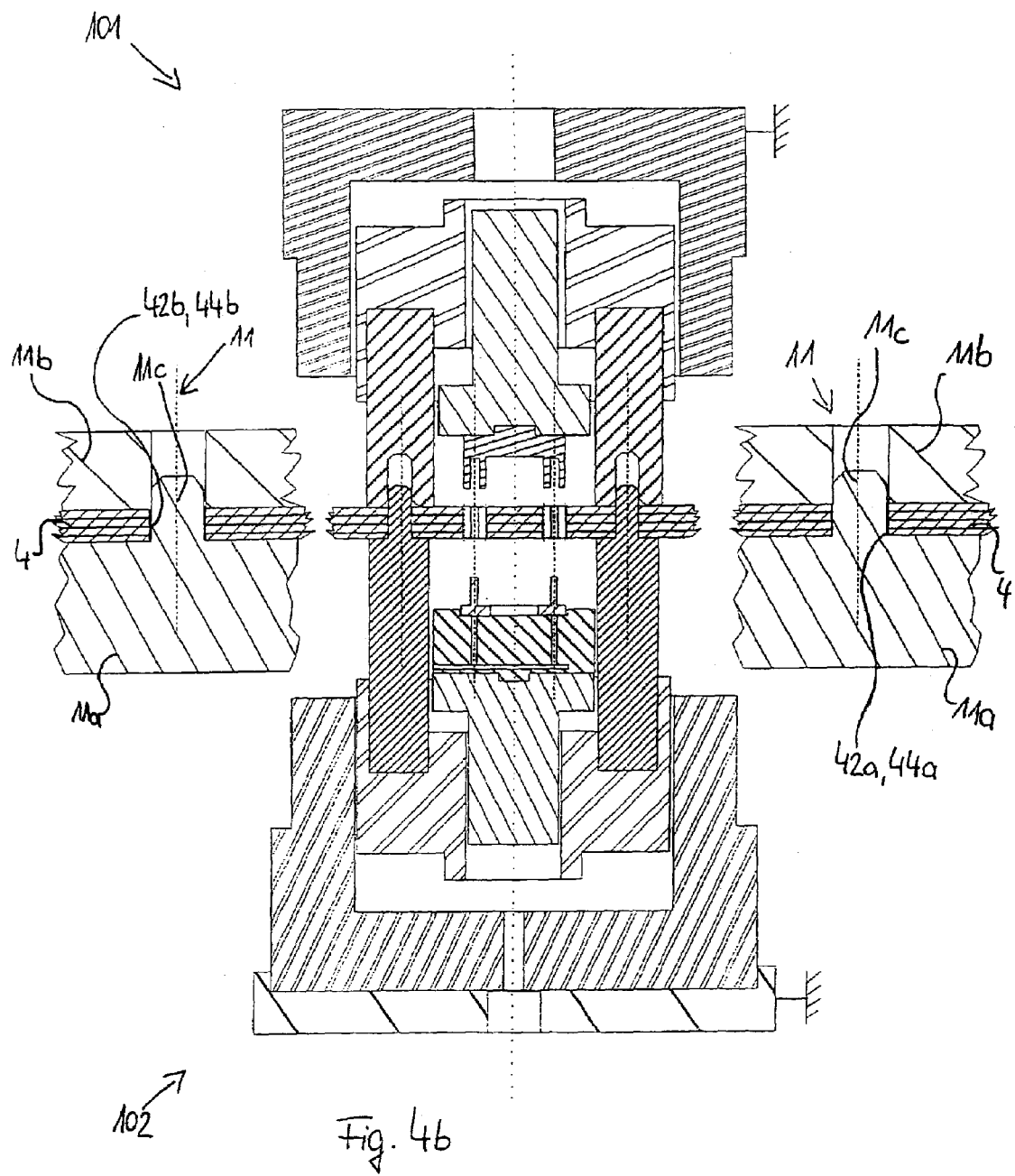
Figure 5:
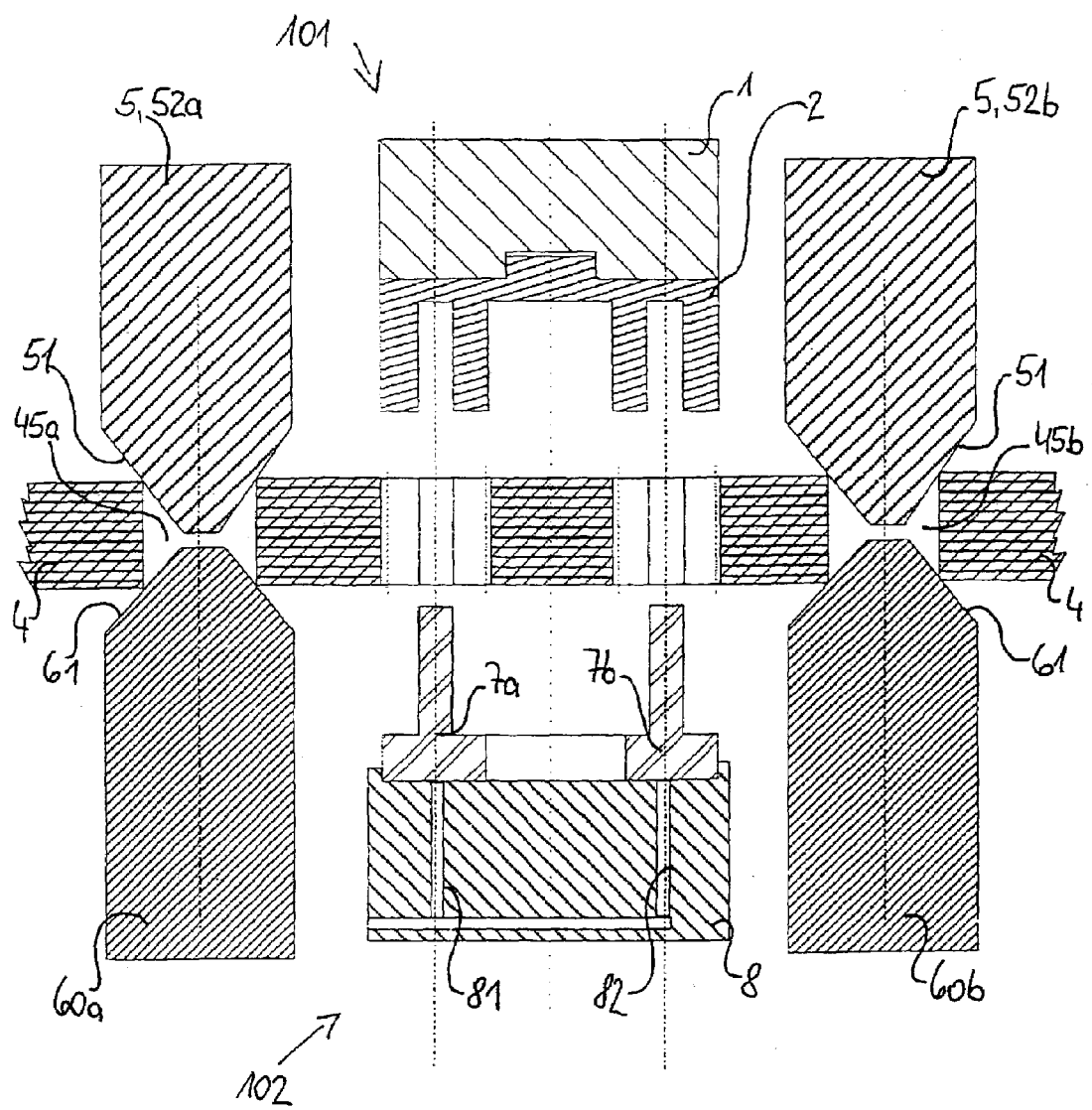
FIG. 5 is a vertical section through an assembly device according to another embodiment.

FIG. 5 shows a further embodiment, which is distinguished from the embodiment depicted in FIG. 4 by a modified configuration of the upper and lower alignment device. Both pins 52*a, b* and pins 60*a, b* of the alignment devices have truncated cone shaped center points 61, which engage with bores 45*a, b*. In this embodiment, pins 52*a, b* and pins 60*a, b* can interact in such a way that the upper tool and the lower tool are also aligned. The diameter of pins 52*a, b* or 60*a, b* is larger than the diameter of the adjustment structures 45*a, b* of magazine 4, so that when center points 51 and 61 engage, a shift and thus an adjustment of magazine 4 occurs.

Figure 6:
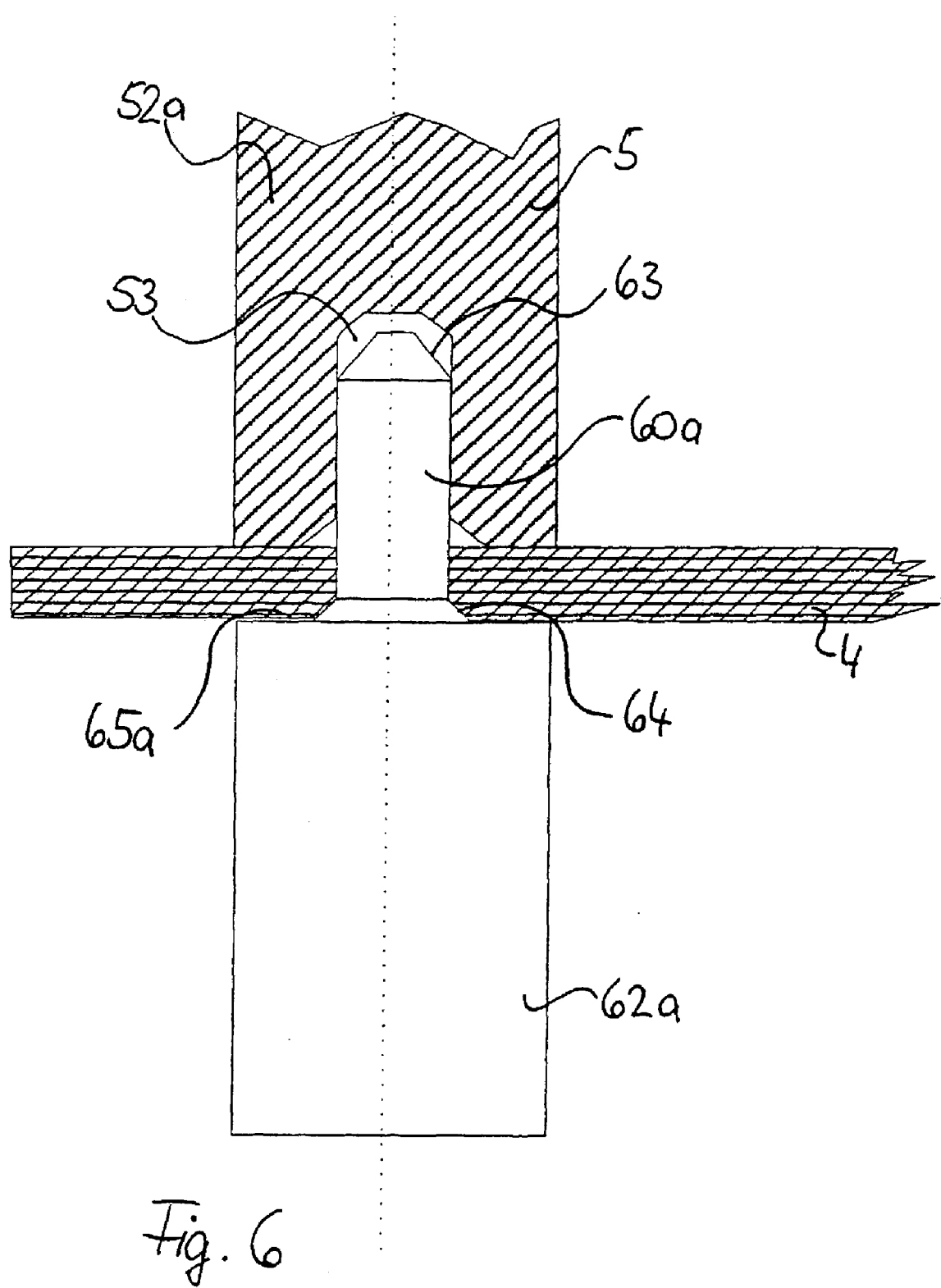
FIG. 6 is a detail section of an alignment device according to a further embodiment.

FIG. 6 depicts a further embodiment of a pilot pin 60*a*. Pin 52*a* has a pin socket 53 with which the pilot pin 60*a* engages. Pilot pin 60*a* has a truncated cone shaped collar 64 that merges into shoulder 65*a* and is pressed into the bottom side of magazine 4 during the clamping and adjustment process. This improves the clamping action and achieves a precise positioning of the magazine.

1 plunger holder
2*a, b* plunger
3*a–c* microcomponents
4 magazine
5 upper alignment device
6 lower alignment device
7*a, b* microcomponent
8 assembly platform
9 upper differential translator
10 lower differential translator
11 foil magazine carrier
11*a* lower part of magazine carrier
11*b* upper part of magazine carrier
11*c* pin
12 upper main translator
13 lower main translator
14 platform holder
15 XY and theta table
16 assembly base
31*a–d* component group
41 cluster
42*a–d* adjustment structure/wafer level
43 stop edge
44*a–d* adjustment structure/cluster level
45*a–d* adjustment structure/group level
51 center point
52*a, b* pin
53*a, b* pin socket
54 end face
60*a, b* pilot pin
61 center point
62*a, b* base part
63 truncated cone shaped surface
64 collar
65*a, b* shoulder
81 suction duct
82 suction duct
100 assembly table
101 upper tool
102 lower tool

The invention claimed is:

1. An assembly device for microcomponents that are arranged in a magazine, comprising an upper tool and a lower tool, which are provided with the following components:
   means for a rough adjustment of the magazine,
   mechanical alignment means for fine adjustment, which engage with adjustment structures on the magazine level, a cluster level or a microcomponent level of the magazine and bring about an alignment of the microcomponents located in the magazine,
   clamping means for fixing the magazine,
   at least one plunger for ejecting at least one microcomponent from the magazine, and
   an assembly platform in the upper tool or in the lower tool for receiving the microcomponents in a defined position.

2. An assembly device according to claim 1, wherein the clamping means are integrated into the alignment means.

3. An assembly device according to claim 1, wherein the alignment means comprise an upper and a lower alignment device which are arranged opposite one another, wherein at least one alignment device is arranged so as to be movable in vertical direction.

4. An assembly device according to claim 3, wherein one of the alignment devices has at least one pin.

5. An assembly device according to claim 4, wherein the pin is a pilot pin.

6. An assembly device according to claim 5, wherein the pilot pin has a diameter of 100 μm to 3 mm.

7. An assembly device according to claim 5, wherein the pilot pin is arranged on a base part with a shoulder.

8. An assembly device according to claim 5, wherein the pilot pin merges into the shoulder via a truncated cone shaped collar.

9. An assembly device according to claim 5, wherein the length of the pilot pin is larger than the thickness of the magazine.

10. An assembly device according to claim 4, wherein the pin has a center point.

11. An assembly device according to claim 10, wherein the center point has a truncated cone shaped or a conical surface.

12. An assembly device according to claim 10, wherein a cone angle of the truncated cone shaped surface or conical surface is 50° to 90°.

13. An assembly device according to claim 1, wherein the upper and the lower alignment device are provided with a pin socket for engagement with the respectively opposite pilot pin.

14. An assembly device according to claim 13, wherein the pin provided with the pin socket has a flat end face.

15. An assembly device according to claim 1, wherein the upper or the lower tool is arranged so as to be adjustable relative to the respectively other tool.

16. An assembly device according to claim 1, wherein the plunger is arranged in the upper tool.

17. An assembly device according to claim 1, wherein the plunger, the assembly platform and the pins are exchangeable.

18. A disk-shaped magazine, comprising:
a magazine material which is adapted to hold at least one microcomponent at least along lateral surfaces of the microcomponent in a positive fit, wherein the magazine material comprises adjustment structures for engagement with mechanical alignment means for fine adjustment on a magazine level, a cluster level, or a microcomponent level, or a combination thereof during assembly of the microcomponents, and wherein the adjustment structures are present on at least two of said levels.

19. A magazine according to claim 18, wherein the adjustment structures are configured as circular, cylindrical, triangular, square or polygonal structures in the magazine.

20. A magazine according to claim 18, wherein the adjustment structures are openings with a diameter ranging from 100 μm to 3 mm.

21. A magazine according to claim 18, wherein the adjustment structures decrease in size from the magazine level to the cluster level to the microcomponent level.

22. A magazine according to claim 21, wherein the adjustment structures have a diameter ranging from 1 mm to 3 mm on the magazine level.

23. A magazine according to claim 21, wherein the adjustment structures have a diameter of 500 μm to 1 mm on the cluster level.

24. A magazine according to claim 21, wherein the adjustment structures have a diameter of 100 μm to 500 μm on the microcomponent level.

* * * * *